United States Patent [19]
Uramoto et al.

[11] Patent Number: 4,885,068
[45] Date of Patent: Dec. 5, 1989

[54] SHEET PLASMA SPUTTERING METHOD AND AN APPARATUS FOR CARRYING OUT THE METHOD

[75] Inventors: Joshin Uramoto, Aichi; Koichi Suzuki; Takuji Oyama; Hiroyasu Kojima, all of Yokohama, Japan

[73] Assignees: Joshin Uramoto, Aichi; Asahi Glass Company, Ltd., Tokyo, both of Japan

[21] Appl. No.: 242,213

[22] Filed: Sep. 9, 1988

[51] Int. Cl.$^4$ .................. C23C 14/34; C23C 14/46
[52] U.S. Cl. .................. 204/192.11; 204/192.12; 204/298
[58] Field of Search .......... 204/192.11, 192.12, 204/192.38, 298 BD, 298 ME, 298 D; 250/398, 424, 425, 426, 492.1, 492.2, 492.3

[56] References Cited
U.S. PATENT DOCUMENTS

| 3,472,751 | 10/1969 | King | 204/192.11 |
| 3,839,182 | 10/1974 | Sager | 204/298 D |
| 4,424,103 | 1/1984 | Cole | 204/298 BD |
| 4,767,931 | 8/1988 | Sato et al. | 204/298 BD |

FOREIGN PATENT DOCUMENTS

| 2148801 | 3/1973 | France . | |
| 2435810 | 4/1980 | France . | |
| 1124568 | 6/1986 | Japan | 204/298 |
| 63-223171 | 9/1988 | Japan . | |
| 633729A5 | 12/1982 | Switzerland . | |

Primary Examiner—Nam X. Nguyen
Attorney, Agent, or Firm—Oblon, Spivak, McClelland, Maier & Neustadt

[57] ABSTRACT

A high-efficient sheet plasma sputtering method and an apparatus for carrying out the method which comprise means for deforming an arc plasma stream into a form of sheet by a magnetic field so that ions in the sheet plasma are accelerated to a target which is controlled to have a negative potential to the sheet plasma, whereby a coating layer is formed by sputtering on a substrate arranged opposite the target with respect to the sheet plasma.

8 Claims, 5 Drawing Sheets

SHEET PLASMA SPUTTERING METHOD AND AN APPARATUS FOR CARRYING OUT THE METHOD

The present invention relates to a sputtering method advantageous for forming a thin coating layer uniformly and quickly on a large surface area by using a sheet plasma and an apparatus for carrying out the sputtering method.

A magnetron type sputtering system mainly used at present as a sputtering method has a simple structure because a target itself functions as an electric discharging cathode for producing a plasma. However, it has the following drawbacks. Namely, a high voltage of electric discharge (a cathode fall voltage) is needed in order to give a high energy to ions in an ionized gas (such as argon) for sputtering, which are forced to a target. Accordingly, an application of an electric discharge is limited to a glow discharge and an electric discharge current density is also limited, with the result that the density of the ion current to the target caused by the cathode fall voltage is limited to an extremely low range in comparison with an arc discharge.

Since a gas pressure for an electric discharge is limited to a high range in comparison with the arc discharge in order to start and maintain a cold cathode discharge (for instance, in case of argon, the pressure has to be as high as about $2 \times 10^{-3}$ Torr $-10^{-2}$ Torr), scattering of sputtered particles becomes large due to the ionized gas. For instance, when argon is used, only small mean free path of about 1 cm–5 cm is provided to thereby reduce efficiency of deposition on a substrate. In other words, when the distance between the target and the substrate is several centimeters or more, the efficiency of deposition is greately reduced, which causes inconvenience in use.

It is an object of the present invention to eliminate the above disadvantages of the conventional system and to provide a high-efficient sputtering method and an apparatus for carrying out the sputtering method.

An aspect of the present invention is to provide a high-efficient sheet plasma sputtering method which comprises deforming an arc plasma stream into a form of sheet by a magnetic field, and accelerating ions in said sheet plasma to a target which is controlled to have a negative potential to said sheet plasma, so that said ions strike the target to cause sputtering of the target material, whereby sputtered particles are deposited on a substrate arranged opposite said target with respect to said sheet plasma, to form a coating layer on said substrate.

Another aspect of the present invention is to provide a high-efficient sheet plasma sputtering apparatus which comprises a vacuum chamber, a pumping system, an arc discharge type plasma source, a first d.c. power source to produce an arc plasma stream from said plasma source, at least one pair of permanent magnets disposed at both sides of said arc plasma stream generated from said plasma source to deform said arc plasma stream in a form of sheet, an anode to form an arc discharge in association with said plasma source, a target arranged along said sheet plasma, a second d.c. power source to maintain an electric potential on said target to be negative to said sheet plasma, whereby a coating layer is formed on a substrate arranged opposite said target with respect to said sheet plasma by depositing sputtered particles generated from said target.

In the drawings:

FIG. 2 is a diagram showing the principle of deforming a cylindrical plasma stream into a sheet plasma, wherein FIG. 2a is a diagram showing a state of a magnetic field and permanent magnets in a cross-sectional view FIG. 2b is a diagram showing a state of magnetic field viewed from the upper part of a permanent magnet and FIG. 2c is a diagram showing a state of magnetic field between a pair of permanent magnets viewed from the axial direction of a plasma stream;

Preferred embodiments of the present invention will be described with reference to the drawings.

Figure 1:
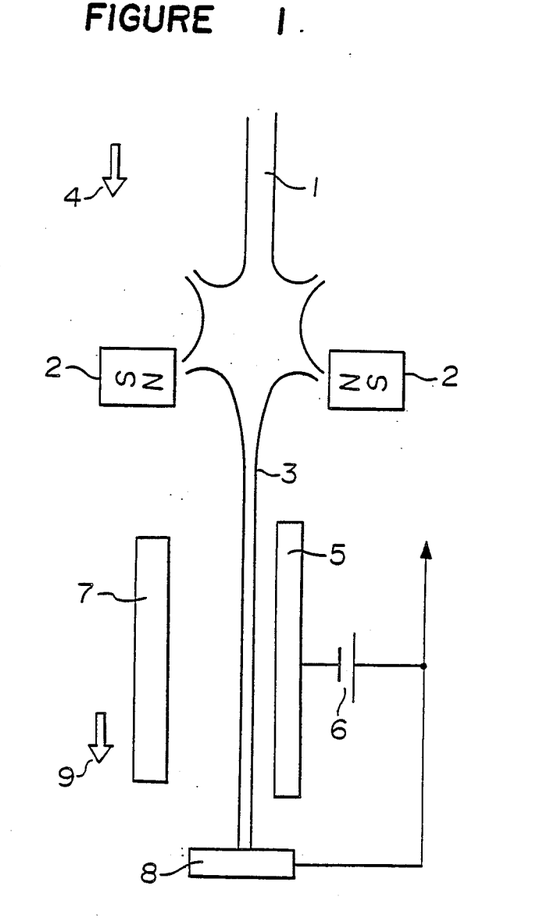
FIG. 1 is a diagram showing a sputtering method according to the present invention.

FIG. 1 shows a sheet plasma viewed from the thickness direction of a sheet plasma. In FIG. 1, a reference numeral 1 designates a cylindrical plasma stream caused by an arc discharge which extends along a magnetic field, numerals 2 designate a pair of rectangular permanent magnets to deform the cylindrical plasma stream into a high performance sheet plasma, a numeral 3 designates the above-mentioned sheet plasma which has a thickness as shown in FIG. 1 (that is, it has a large width in the direction perpendicular to the drawing), a numeral 4 designates an initial magnetc field mainly produced by outer magnetic generating means in the same direction as the plasma stream, a numeral 5 designates a target for sputtering to which an ion stream comes from the surface of the sheet plasma (the target has a thickness, i.e. it has a large width in the direction perpendicular to the drawing), a numeral 6 designates a d.c. power source for applying a negative bias voltage to the target 5 with respect to the sheet plasma 3, a numeral 7 designates a substrate on which a thin coating layer is formed by sputtered particles, a numeral 8 designates an anode for producing an arc discharge in association with a thermionic cathode, and a numeral 9 designates a magnetic field having a direction directing to the anode 8.

In the present invention, a plasma produced by an arc discharge is utilized. As an arc discharge type plasma source, a double-cathode type plasma generating apparatus, a pressure gradient type plasma generating apparatus, or a plasma generating apparatus in combination of such apparatuses are preferably used. Such plasma generating apparatus is disclosed in a publication "Shinkū" Vol. 25, No. 10 (published in 1982).

The double-cathode type plasma generating apparatus is such an apparatus that an auxiliary cathode having a small heat capacity and a main cathode of $LaB_6$ are provided and the main cathode $LaB_6$ is heated by concentrating an initial discharge to the auxiliary cathode to thereby cause an arc discharge from the main cathode $LaB_6$ as the final cathode. The auxiliary cathode may be of a coil form made of tungsten or of a pipe form made of tantalum.

Figure 5:
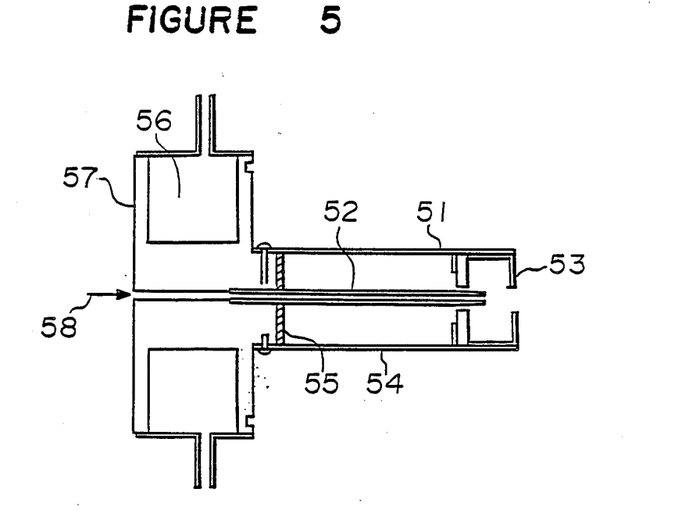
FIG. 5 is a diagram of an embodiment of the double-cathode type arc discharge plasma generating apparatus.

FIG. 5 is a diagram of an embodiment of the double-cathode type arc discharge plasma generating apparatus having a circular disc-like main cathode 51 made of LaB$_6$ and a pipe-shaped auxiliary cathode 52 made of tantalum. In FIG. 5, a reference numeral 53 designates a circular plate made of tungsten which protects the cathodes, a numeral 54 designates a cylindrical member made of molybdenum, a numeral 55 designates a circular heat shielding plate made of molybdenum, a numeral 56 designates cooling water, a numeral 57 designates a cathode supporting table made of stainless steel and a numeral 58 designates a gas inlet port. In the double-cathode type plasma generating apparatus such as the one having the above-mentioned construction, which adopts such system that the auxiliary cathode having a small heat capacity is concentratedly heated by the initial discharge so as to operate it as an initial cathode, the main cathode of LaB$_6$ is indirectly heated, and finally an arc discharge is caused by the main cathode of LaB$_6$, there is a great advantage that further increase in temperature in the auxiliary cathode is avoidable since the main cathode of LaB$_6$ is heated at a temperature of 1,500° C.–1,800° C. to thereby generate a large current of electrons before the auxiliary cathode is heated to a temperature higher than 2,500° C., which may adversely affect the lifetime of the apparatus.

In the pressure gradient type plasma generating apparatus, an intermediate electrode is disposed between a cathode and an anode, whereby an electric discharge is effected by providing a pressure of about 1 Torr in a region of the cathode and a pressure of about $10^{-3}$ Torr in the region of the anode. In such pressure gradient type plasma generating apparatus, there is little danger of damage of the cathode due to a reverse flow of ions from the region of the anode, and a large current electric discharge is possible because efficiency of a carrier gas to produce an electron beam is remarkably high in comparison with an electric discharging method without using the intermediate electrode.

Figure 6:
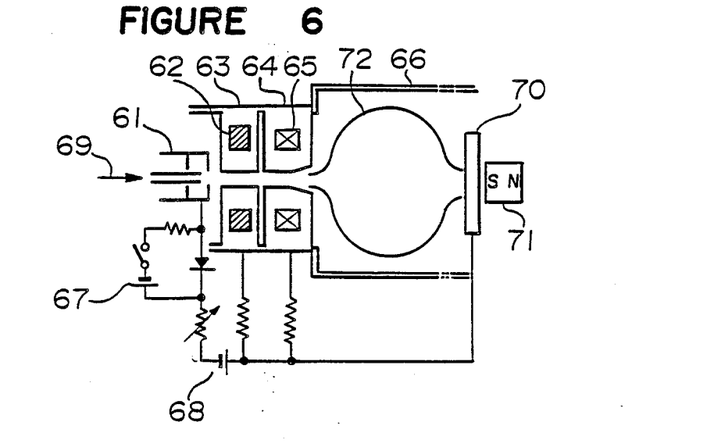
FIG. 6 is a diagram of an embodiment of the pressure gradient type plasma generating apparatus.

FIG. 6 is a diagram showing an example of the pressure gradient type plasma generating apparatus. In FIG. 6, a reference numeral 61 designates a cathode, a numeral 63 designates a first intermediate electrode including a ringed permanent magnet 62 and a numeral 64 designates a second intermediate electrode including an air-core coil 65. The plasma generating apparatus is adapted to produce a plasma 72 in a vacuum chamber 66. A numeral 67 designates an electric discharge starting power source to start an electric discharge between the cathode 61 and the anode 70, a numeral 68 designates a main power source to maintain a steady electric discharge from the cathode 61, a numeral 69 designates a gas inlet port and a numeral 71 is a magnet for converging a plasma.

Besides the above-mentioned double-cathode type plasma generating apparatus and the pressure gradient type plasma generating apparatus, an apparatus in combination of the features of the both apparatuses, i.e. having a double-cathode as a cathode and intermediate electrodes, is preferably used in the present invention because the advantages by the both apparatus can be obtained. For instance, a pressure gradient type plasma generating apparatus having a double-cathode as shown in FIG. 5 for the cathode 61 in FIG. 6 is preferably used in the present invention.

Figure 2:
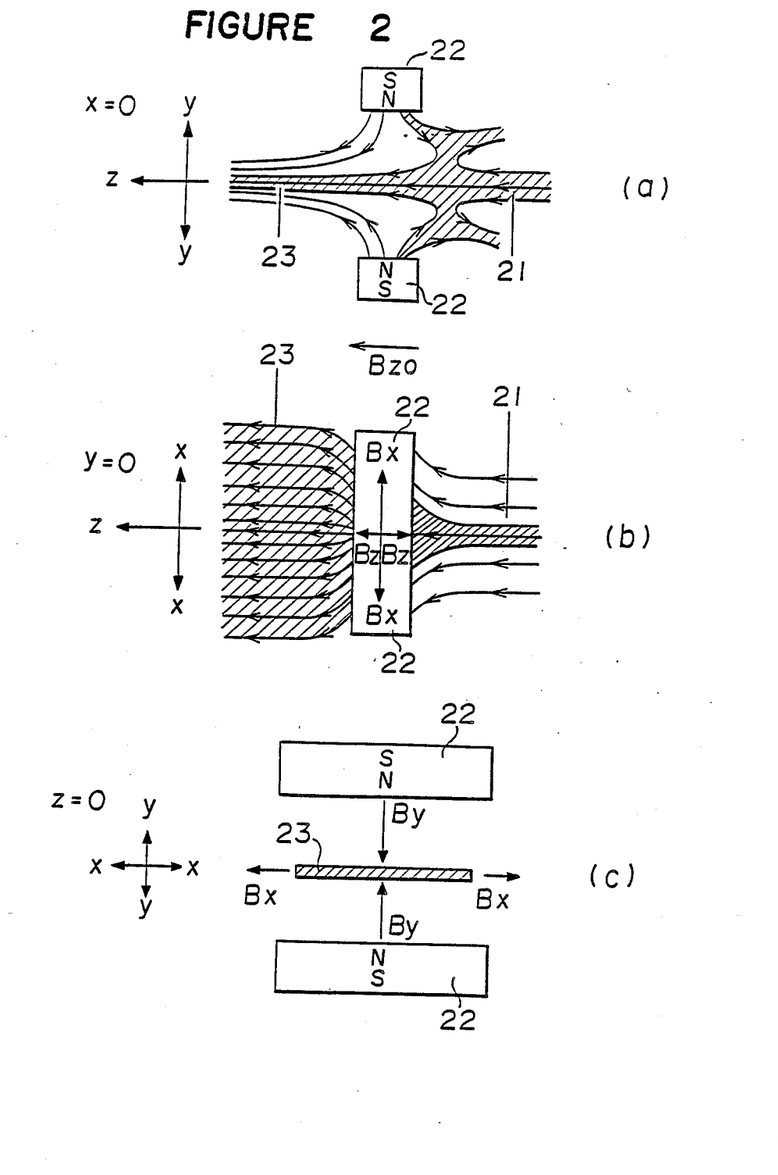

The arc plasma stream 1 produced from the arc discharge type plasma source is in a cylindrical form. The cylindrical plasma stream 1 is deformed by a magnetic field generated from the permanent magnets 2 into a form of sheet, whereby there is obtained an elongated, thin, wide sheet plasma 3. The principle of deforming the cylindrical plasma stream into a form of sheet is shown in FIG. 2. Namely, a magnetic field (having components Bx, By, Bz) formed by permanent magnets 22 is formed in addition to the initial magnetic field Bzo. The component Bx of magnetic field is to expand the cylindrical plasma stream 21 so that the width of the sheet plasma 23 is widened. The component By is to compress the cylindrical plasma stream 21 so that the thickness of the sheet plasma 23 is reduced. It is necessary that the component Bz of the magnetic field extending in the axial direction of the plasma stream is not greater than the initial magnetic field Bzo.

Namely, in FIG. 1, it is necessary that the initial magnetic field 4 extending in the axial direction of the plasma stream is greater than a component Bz of the magnetic field which is produced by the rectangular permanent magnets 2. The initial magnetic field 4 can be strengthened by an outer magnetic field generating means. Thus, uniformity in width, thickness and density of the sheet plasma can be desirably adjusted by changing the intensity of the initial magnetic field Bzo and the magnetic field (Bx, By, Bz) produced by the permanent magnets.

For instance, there can be easily produced a sheet plasma having a thickness of 1–2 cm, a width of 10–50 cm and a length of 0.2–3 m.

Thus obtained sheet plasma 3 is converged to the anode 8 to obtain an arc discharge. A magnetic field 9 directing in the direction of the anode 8 is formed by using an outer magnetic field producing means such as an air-core coil so that the sheet plasma 3 is guided toward the anode 8 in a stable manner.

Ions in the sheet plasma 3 are accelerated to the target 5 which is maintained at a negative potential by the d.c. power source 6, so that the ions strike the target to cause sputtering of a material which constitutes a target. Particles produced by the sputtering are deposited on the substrate 7, whereby a thin coating layer is formed on the substrate 7.

It is possible to use a target 5 having a large surface area. When such target 5 is used, it is necessary to provide uniformly an incident ion stream of large current density to the large surface area. A conventionally used arc plasma stream in a magnetic field is cylindrical, and the distribution in density of the plasma rapidly decreases from the central area (which has a width of about 1 cm) to the circumferential part. Accordingly, the conventional arc plasma is not satisfactory.

In accordance with the present invention utilizing the above-mentioned sheet plasma, sputtering of the target having a large surface area can be effectively performed because an incident ion stream having uniform large current density can be provided from the sheet plasma to the large target effectively.

It is preferable that the target 5 is disposed in parallel to the sheet plasma 3 to obtain uniform sputtering.

It is preferable that the substrate 7 on which a thin coating layer is formed is arranged opposite the target 5 with the sheet plasma 3 interposed therebetween. In particular, parallel arrangement of the target 5 and the sheet plasma 3 provides uniform deposition of the sputtered particles to thereby form a thin uniform coating layer on the substrate.

As the substrate on which a thin coating layer is formed, a glass plate, a metallic plate, a plastic film, a metallic film and so on can be used; however, it is not limited to these materials.

The technique used in the present invention is effective for coating various types of film material on a substrate or a film having a large surface area in a field such as windows for buildings. The layers formed by the sputtering method of the present invention can be applied for a transparent electrode for a liquid crystal display element, an electrode for a solar battery, infrared reflecting glass, electromagnetic shielding glass, low-emissivity glass and so on. Such materials may be formed of the ITO (tin-doped indium oxide), fluorine or antimony-doped tin oxide, metal such as Ag, Al, Si, Zr, Ti, Cu, Cr, Zn, Ce, or oxides, borides, sulfides thereof, although there is no limitation to these materials.

Figure 3:
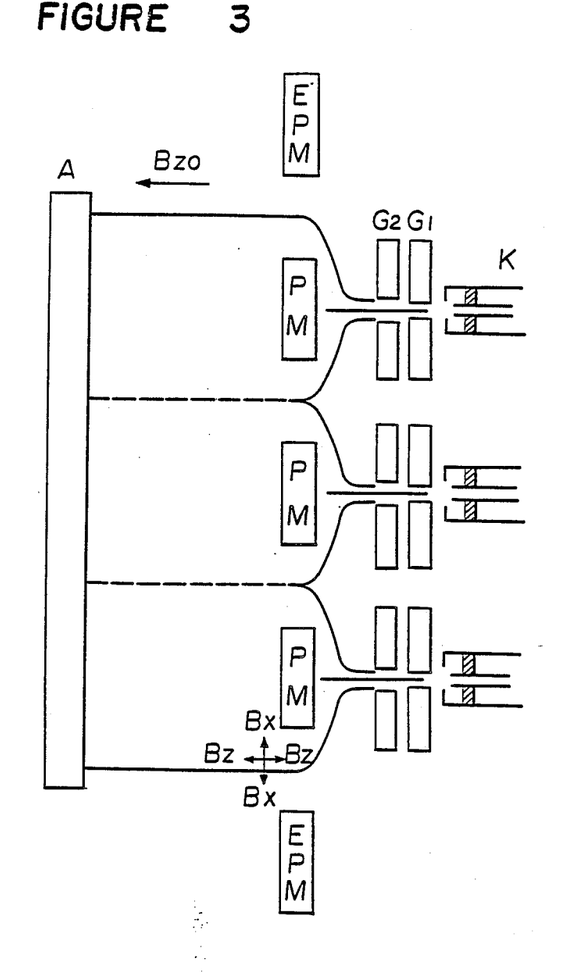
FIG. 3 is a diagram showing an example to form a sheet plasma having a large surface area by using a plurality of plasma sources.

A sheet plasma having a large surface area can be formed by combining a plurality of streams of plasma generated from a plurality of plasma sources. For instance, a device as shown in FIG. 3 may be used. FIG. 3 shows that three pressure gradient type plasma generating apparatuses are arranged side by side with each other, each having a cathode K in a double-cathode form to effect an arc discharge to a common anode A and intermediate electrodes G1, G2. The arc plasma stream generated from the plasma generating apparatus is deformed into a sheet form by means of a pair of permanent magnets PM. In this case, it is necessary to arrange extra permanent magnets (EPM) as shown in FIG. 3 so as to keep symmetry of the magnetic field component Bx in the direction expanding the width of the sheet plasma at both ends of permanent magnets arranged in line. Thus, it is possible to form a thin coating layer on the substrate having a large surface area by using the sheet plasma having a large surface area.

Figure 4:
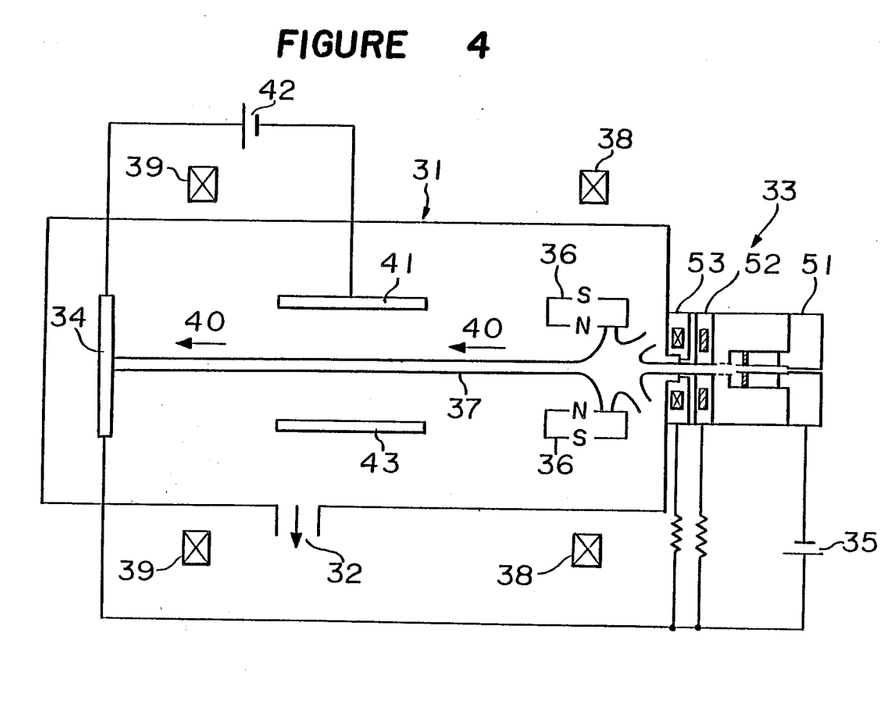
FIG. 4 is a diagram showing an embodiment of the sputtering apparatus according to the present invention.

An embodiment of the sputtering apparatus of the present invention will be described with reference to FIG. 4. In FIG. 4, a reference numeral 31 designates a vacuum chamber and a numeral 32 designates a pumping system.

A cathode 51 produces a plasma by an arc discharge in association with an anode 34 connected to a d.c. power source 35. A numeral 52 designates a first intermediate electrode including a ringed permanent magnet and a numeral 53 designates a second intermediate electrode including an air-core coil. The first and second intermediate electrodes form an electric and magnetic field so that the arc plasma stream generated from the cathode 51 is guided effectively to the anode region.

A numeral 33 designates an arc discharge type plasma source comprising the cathode 51 and the first and second intermediate electrodes 52, 53. The inside of the plasma source is kept at a pressure of about 1 Torr, and an arc discharge cylindrical plasma stream is produced in the vacuum chamber 31 which is kept at a pressure of about $10^{-3}$ Torr by the pumping system 32.

A numeral 36 designates a pair of permanent magnets disposed at the both sides of the cylindrical plasma stream produced from arc discharge type plasma source 33 to thereby deform the cylindrical plasma into a sheet plasma 37.

FIG. 4 is a diagram showing a sheet plasma 37 viewed from the direction of the thickness of the plasma. Namely, the magnets 36 and the sheet plasma 37 respectively have a length and width in the direction perpendicular to the drawing.

Numerals 38, 39 designate air-core coils to form a magnetic field 40 directed from the arc discharge type plasma source 33 to the anode 34 so that the sheet plasma 37 can be guided to the anode 34 stably and effectively.

A numeral 41 designates a target which is biased by a d.c. power source 42 to have a negative potential with respect to the sheet plasma 37. A numeral 43 designates a substrate on which a thin coating layer is formed by the deposition of particles produced by bombardment of ions from the sheet plasma to the target 41.

When formation of a thin coating layer is continuously performed, the substrate or a film may be transferred in the direction perpendicular to the drawing to increase efficiency.

Since a high density sheet plasma used in the present invention is produced by an arc discharge, the density of plasma is 50-100 times higher than a conventional glow discharge type plasma utilized for magnetron sputtering or ion plating, and the degree of ionization of gas reaches several tens percents. Therefore, a high ion density, a high electron density and a neutral active particles density can be obtained. When the target and the substrate face such high density plasma and a negative voltage is applied to the target as in the present invention, an extremely large number of ions can be taken from the sheet plasma to the target, whereby a high speed sputtering at a speed 2-5 times as high as the conventional magnetron sputtering is obtainable.

In the present invention, a sheet plasma having a uniform plasma density is used as an ion source for sputtering on the entire surface of the target. Accordingly, a large effective surface area of target can be obtained since ions strike uniformly from the sheet plasma on the entire surface of the target. Namely, it is advantageous in coating on a large surface area. Accordingly, the sputtering method of the present invention provides a sputtering current greater than that of the conventional magnetron sputtering under the condition of using the same target voltage, hence, the speed of forming a layer by this invention is high.

Further, in the present invention, an electron emission system with use of a thermionic cathode by arc discharge is adopted. Accordingly, the pressure of ionized gas can be lower than a cold cathode system by glow discharge. For instance, when argon is used as gas for electric discharge, it is possible to set the pressure of the chamber lower than $2 \times 10^{-4}$ Torr. Accordingly, scattering of sputtered particles can be reduced, and therefore the mean free path can be elongated.

Further, environment gas such as argon, oxygen and so on become active ions and neutral particles in the sheet plasma and in addition, sputtered particles and reactive gas such as oxygen atoms pass through the high density plasma before they reach the substrate, so that they become highly reactive ions and neutral active seeds. As a result, reaction on the substrate increases, whereby formation of a high quality layer can be realized at a high speed without heating the substrate. Especially, when a transparent conductive layer such as an ITO layer is formed, the layer of good quality and a low resistance can be quickly obtained without heating the substrate.

In the conventional magnetron sputtering, the target is used as an electrode to generate a plasma. On the other hand, in the sputtering method of the present invention, the density of sheet plasma is controlled by the d.c power source for the arc discharge plasma source, and a sputtering speed is controlled by the d.c. power source for the target independently of the plasma density. Accordingly, it is possible to separately control the plasma density and the sputtering speed.

Thus, the method and the apparatus of the present invention provide excellent effect that a coating layer can be uniformly formed at a high speed over a large substrate.

EXAMPLE 1

A sintered product (10 cm×40 cm) of indium oxide containing 7.5 wt % of tin was prepared as a target, and non-alkali glass (manufactured by Asahi Glass Company Ltd., tradename: AN glass, 10 cm×30 cm) was prepared as a substrate. The substrate was not heated before deposition. The target and the substrate were set in a vacuum chamber in the present invention. The chamber was evacuated to a pressure of $1 \times 10^{-5}$ Torr or lower. Then, argon gas was introduced in a pressure gradient type plasma source having a double cathode to cause an arc discharge. Then, argon and oxygen gas were introduced in the chamber so as to give a sputtering pressure of $1 \times 10^{-3}$ Torr and a partial pressure of oxygen of 2%. A sputtering voltage of $-400$ V was applied to the target, and an ITO (Indium-Tin-Oxide) layer was formed for one minute while the substrate was still. In this case, the distance between the target and the sheet plasma was about 3 cm, the distance between the sheet plasma and the substrate was about 4 cm, and the distance between the target and the substrate was about 8 cm. During the formation of the layer, the electric current of the arc discharge was 180 A and the sputtering current was 9.3 A. The properties of the ITO layer are as follows. Layer thickness: 4,800 Å, specific resistance: $2.5 \times 10^{-4}$ Ωcm, and transmittance at a wavelength of 550 nm: 82%.

COMPARATIVE EXAMPLE 1

An ITO coating layer was formed on the same substrate using same target as in Example 1 in a d.c. magnetron sputtering apparatus. The substrate was not heated before deposition.

The chamber was evacuated to a pressure of $1 \times 10^{-5}$ Torr or lower. Then, argon and oxygen gas were introduced in the chamber so as to give a sputtering pressure of $1 \times 10^{-3}$ Torr and a partial pressure of oxygen of 2%. The distance between the target and the substrate was about 8 cm.

A sputtering voltage of $-400$ V was applied to the target, and layer of ITO was formed for one minute while the substrate was still. The sputtering current was 3.0 A. The properties of the ITO layer were as follows. Layer thickness: 1,800 Å, specific resistance: $7.2 \times 10^{-4}$ Ωcm, and transmittance at a wavelength of 550 nm: 80%.

EXAMPLE 2

A metal plate (10 cm×40 cm) of titanium as a target and a float glass plate (10 cm×30 cm) as a substrate were respectively prepared. The substrate was not heated before deposition. The target and the substrate were set in a vacuum chamber of the present invention. The chamber was evacuated at a pressure $1 \times 10^{-5}$ Torr or lower. Argon was introduced in the plasma source to cause an electric discharge. Then, oxygen gas was introduced in the chamber to give a sputtering pressure of $1.2 \times 10^{-3}$ Torr. The distance between the target and the substrate was about 8 cm as in Example 1. A sputtering voltage of $-450$ V was applied to the target and a $TiO_2$ layer was formed for 10 minutes while the substrate was still. The electric current of the arc discharge was 200 A and the sputtering current was 13.8. The thickness of the $TiO_2$ layer obtained was 1,900 Å, and the coated layer was transparent.

COMPARATIVE EXAMPLE 2

A $TiO_2$ was formed on the same substrate using same target as in Example 2 in a d.c. magnetron sputtering apparatus. The substrate was not heated before deposition.

The chamber was evacuated to a pressure of $1 \times 10^{-5}$ Torr or lower. Oxygen gas was introduced in the chamber to give a sputtering pressure of $1.2 \times 10^{-3}$ Torr. The distance of the target and the substrate was about 8 cm. A sputtering voltage of $-450$ V was applied to the target and a $TiO_2$ layer was formed for 10 minutes while the substrate was still. The sputtering current was 6.8 A. The thickness of the $TiO_2$ layer obtained was 800 Å and the layer was transparent.

We claim:

1. A high-efficient sheet plasma sputtering method which comprises deforming an arc plasma stream into a form of sheet plasma by a magnetic field, and accelerating ions in said sheet plasma to a target which is controlled to have a negative potential to said sheet plasma, so that said ions strike the target to cause sputtering of the target material, whereby sputtered particles are deposited on a substrate arranged opposite said target with respect to said sheet plasma, to form a coating layer on said substrate.

2. A sheet plasma sputtering apparatus which comprises a vacuum chamber, a pumping system, an arc discharge type plasma source, a first d.c. power source to produce an arc plasma stream from said plasma source, a first magnetic field producing means to provide a magnetic field to deform said arc plasma stream into a form of sheet plasma, an anode to form an arc discharge in association with said plasma source, a second magnetic field producing means to form a magnetic field which effectively guides said plasma stream deformed in a form of sheet plasma to said anode, a target arranged along said sheet plasma, a second d.c. power source to maintain an electric potential on said target to be negative to said sheet plasma, whereby a coating layer is formed on a substrate arranged opposite said target with respect to said sheet plasma by depositing particles sputtered from said target.

3. The sheet plasma sputtering apparatus according to claim 2, wherein said arc discharge type plasma source is a double-cathode type plasma source which is provided with an auxiliary cathode having a small heat capacity and a main cathode made of $LaB_6$ wherein an initial discharge is concentrated to said auxiliary cathode and said main cathode is heated by utilizing the initial discharge so that an arc discharge is effected by said main cathode as a final cathode.

4. The sheet plasma sputtering apparatus according to claim 3, wherein said auxiliary cathode is a pipe made of tantalum or a coil made of tungsten.

5. The sheet plasma sputtering apparatus according to claim 2, wherein said arc discharge type plasma source is a pressure gradient type plasma generating apparatus comprising a thermionic cathode and an intermediate electrode device interposed between said thermionic cathode and an anode to form an arc discharge in association with said cathode.

6. The sheet plasma sputtering apparatus according to claim 5, wherein said intermediate electrode device comprises a first intermediate electrode including a ringed permanent magnet and a second intermediate electrode including an air-core coil.

7. The sheet plasma sputtering apparatus according to claim 2, wherein said second magnetic field producing means to form a magnetic field which effectively guides said sheet plasma to said anode is one or more air-core coils arranged around said sheet plasma.

8. The sheet plasma sputtering apparatus according to claim 2, wherein said first magnetic field producing means to provide a magnetic field to deform the arc plasma stream into a form of sheet plasma is at least one pair of permanent magnets disposed at both sides of the arc plasma stream generated from the arc discharge type plasma source.

* * * * *